(12) United States Patent
Ma et al.

(10) Patent No.: US 12,093,489 B2
(45) Date of Patent: Sep. 17, 2024

(54) SENSOR DEVICE AND DRIVING METHOD THEREOF

(71) Applicant: SAMSUNG DISPLAY CO., LTD., Yongin-si (KR)

(72) Inventors: Hyung Gun Ma, Yongin-si (KR); Moon Jae Jeong, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 133 days.

(21) Appl. No.: 17/730,549

(22) Filed: Apr. 27, 2022

(65) Prior Publication Data
US 2023/0117808 A1  Apr. 20, 2023

(30) Foreign Application Priority Data
Oct. 19, 2021  (KR) .................. 10-2021-0139705

(51) Int. Cl.
| G06F 3/044 | (2006.01) |
| G06F 1/04 | (2006.01) |
| G06F 3/041 | (2006.01) |
| H03F 3/68 | (2006.01) |
| H03F 3/70 | (2006.01) |
| H03M 1/12 | (2006.01) |
| G09G 3/3275 | (2016.01) |

(52) U.S. Cl.
CPC .......... *G06F 3/044* (2013.01); *G06F 3/04182* (2019.05); *H03F 3/68* (2013.01); *H03F 3/70* (2013.01); *H03M 1/12* (2013.01); *G06F 1/04* (2013.01); *G09G 3/3275* (2013.01)

(58) Field of Classification Search
CPC ....... G06F 3/044–0448; G06F 3/04182; G06F 3/04166; G06F 3/0416; G06F 1/04; G06F 1/3262; G09G 3/3275; H03F 3/68; H03F 3/70; H03M 1/12; H03M 1/121
See application file for complete search history.

(56) References Cited

U.S. PATENT DOCUMENTS

| 9,639,733 B2 | 5/2017 | Kremin et al. | |
| 10,146,985 B2 | 12/2018 | Chung et al. | |
| 2012/0068966 A1* | 3/2012 | Washburn | G06F 3/0418 345/174 |
| 2012/0326910 A1* | 12/2012 | Hargreaves | G08C 19/12 341/176 |
| 2013/0162585 A1* | 6/2013 | Schwartz | G06F 3/0446 345/174 |
| 2018/0267639 A1 | 9/2018 | Han | |

FOREIGN PATENT DOCUMENTS

| KR | 10-1628894 | 6/2016 |
| KR | 10-2018-0015025 | 2/2018 |

* cited by examiner

*Primary Examiner* — David Tung
(74) *Attorney, Agent, or Firm* — F. Chau & Associates, LLC

(57) ABSTRACT

A sensor device includes: first sensors; second sensors generating a mutual capacitance with the first sensors; a sensor transmitter connected to the first sensors, the sensor transmitter supplying driving signals to the first sensors; and a sensor receiver connected to the second sensors. The sensor receiver receives sensing signals from the second sensors. The sensor receiver includes a band pass filter including a plurality of paths connected in parallel. A first path among the plurality of paths sequentially includes an input mixer, a filter, and an output mixer.

18 Claims, 12 Drawing Sheets

SENSOR DEVICE AND DRIVING METHOD THEREOF

CROSS-REFERENCE TO RELATED APPLICATION

The present U.S. non-provisional patent application claims priority under 35 U.S.C. § 119(a) to Korean patent application 10-2021-0139705 filed on Oct. 19, 2021 in the Korean Intellectual Property Office, the entire disclosure of which is incorporated by reference herein.

1. TECHNICAL FIELD

The present disclosure generally relates to a sensor device and a driving method thereof.

2. DISCUSSION OF RELATED ART

With the development of information technologies, the importance of a display device which is a connection medium between a user and information increases. Accordingly, display devices such as a liquid crystal display device and an organic light emitting display device are increasingly used.

A display device may include a display unit for displaying an image and a sensor unit for sensing an input of a user. The sensor unit may include a filter for acquiring signals of a desired frequency band from the sensing signals. The filter may include an operational amplifier (OP-amp), a resistor, and a capacitor. When the filter includes the OP-amp, the size and power consumption of the filter may be increased. However, a center frequency and Q factor of the filter may be changed according to a manufacturing deviation, a supply voltage of a power supply, or a temperature.

SUMMARY

At least one embodiment of the disclosure provides a sensor device and a driving method thereof using a filter, which can decrease a size and power consumption of the filter, and stably maintain a center frequency and Q factor of the filter.

In accordance with an embodiment of the present disclosure, there is provided a sensor device including: first sensors; second sensors generating a mutual capacitance with the first sensors; a sensor transmitter connected to the first sensors, the sensor transmitter supplying driving signals to the first sensors; and a sensor receiver connected to the second sensors, the sensor receiver receiving sensing signals from the second sensors, wherein the sensor receiver includes a band pass filter including a plurality of paths connected in parallel, and wherein a first path among the plurality of paths sequentially includes a first input mixer, a first filter, and a first output mixer.

A frequency and a phase of a first input clock signal received by the first input mixer may be equal to a frequency and a phase of a first output clock signal received by the first output mixer.

A second path among the plurality of paths may sequentially include a second input mixer, a second filter, and a second output mixer. A frequency and a phase of a second input clock signal received by the second input mixer may be equal to a frequency and a phase of a second output clock signal received by the second output mixer.

The frequency of the first input clock signal may be equal to the frequency of the second input clock signal, and the phase of the first input clock signal may be different from the phase of the second input clock signal.

A central frequency of a passband of the first filter may be set as a difference or a sum of the frequency of the input clock signal and a frequency of the driving signals.

The frequency of the first input clock signal may be equal to the frequency of the driving signals.

The frequency of the first input clock signal may be different from the frequency of the driving signals.

The sensor receiver may further include a charge amplifier configured to receive the sensing signals from two sensors among the second sensors. The band pass filter may be connected to an output terminal of the charge amplifier.

The sensor receiver may further include: a mixer configured to mix an output signal of the band pass filter and a local clock signal; a low pass filter configured to filter an output signal of the mixer to have a set frequency band; and an analog-to-digital converter configured to convert an output signal of the low pass filter into a digital signal.

The sensor receiver may further include: a first demodulator configured to demodulate an output signal of the band pass filter, based on a first demodulation clock signal; and a second demodulator configured to demodulate the output signal of the band pass filter, based on a second demodulation clock signal having a phase different by 90 degrees from a phase of the first demodulation clock signal.

The sensor receiver may further include: a first low pass filter configured to filter an output signal of the first demodulator to have a set frequency band; and a second low pass filter configured to filter an output signal of the second demodulator to have a set frequency band.

The set frequency bands of the first low pass filter and the second low pass filter may be lower than set frequency band of the band pass filter.

The sensor receiver may further include: a first analog-to-digital converter configured to convert an output signal of the first low pass filter into a first digital signal; and a second analog-to-digital converter configured to convert an output signal of the second low pass filter into a second digital signal.

The sensor receiver may further include a signal processor configured to determine a final sensing value by adding a square value of the first digital signal and a square value of the second digital signal.

The sensor receiver may further include: a first band pass filter configured to filter an output signal of the first demodulator to have a set frequency band; and a second band pass filter configured to filter an output signal of the second modulator to have a set frequency band.

The set frequency bands of the first band pass filter and the second band pass filter may be lower than set frequency band of the band pass filter, and have central frequencies greater than 0 Hz.

The sensor receiver may further include: a first analog-to-digital converter configured to convert an output signal of the first band pass filter into a first digital signal; and a second analog-to-digital converter configured to convert an output signal of the second band pass filter into a second digital signal.

The sensor receiver may further include a signal processor configured to determine a final sensing value by adding a square value of the first digital signal and a square value of the second digital signal.

In accordance with an embodiment of the present disclosure, there is provided a method of driving a sensor device, the method including: supplying driving signals to first sensors; receiving sensing signals from two adjacent second sensors generating a mutual capacitance with the first sensors; amplifying a difference of the sensing signals to generate an amplified difference; and filtering the amplified signal by allowing the amplified signal to pass through a plurality of paths connected in parallel, wherein a first path among the plurality of paths sequentially includes an input mixer, a filter, and an output mixer.

A frequency and a phase of a first input clock signal received by the first input mixer may be equal to a frequency and a phase of a first output clock signal received by the first output mixer.

BRIEF DESCRIPTION OF THE DRAWINGS

The above and other features of the disclosure will become more apparent by describing in further detail embodiments thereof with reference to the accompanying drawings, in which.

DETAILED DESCRIPTION OF THE EMBODIMENTS

Figure 1:
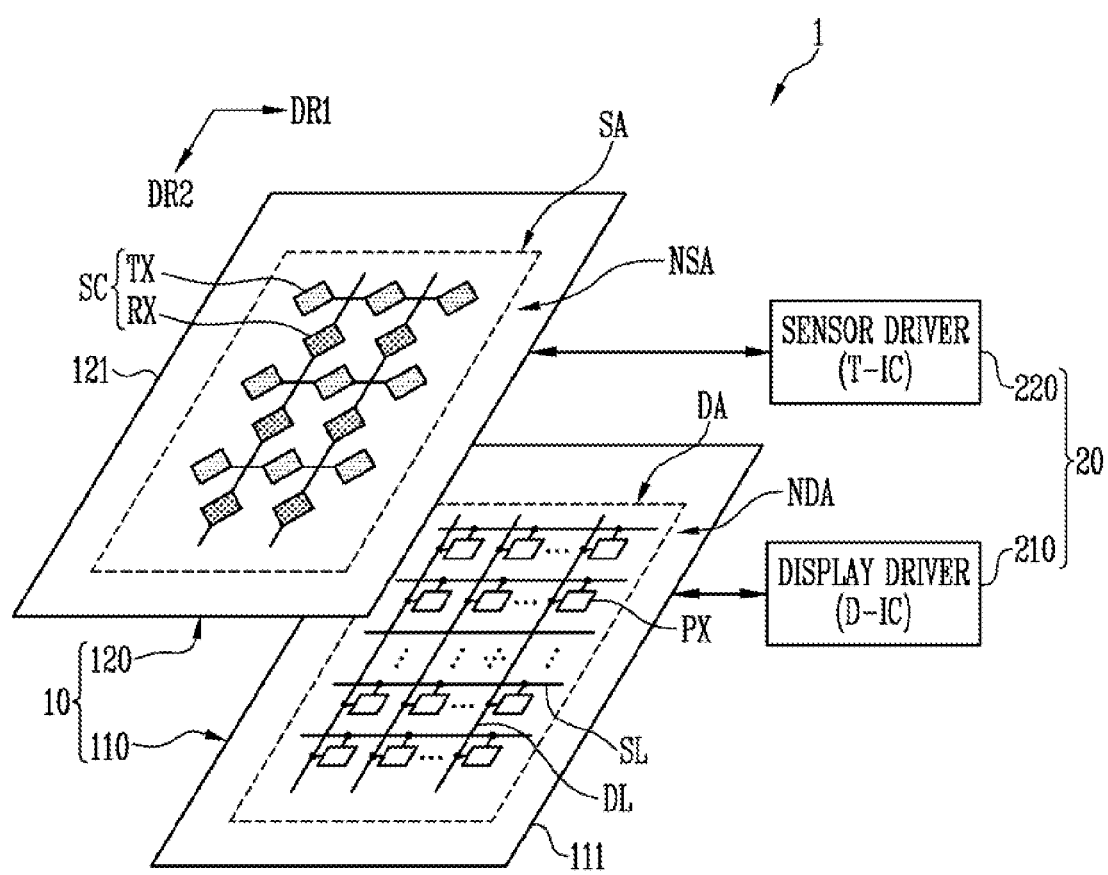
FIGS. 1 and 2 are diagrams illustrating a display device in accordance with an embodiment of the present disclosure.

Hereinafter, exemplary embodiments are described in detail with reference to the accompanying drawings so that those skilled in the art may practice the present disclosure. The present disclosure may be implemented in various different forms and is not limited to the exemplary embodiments described in the present specification.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

A part irrelevant to the description will be omitted to clearly describe the present disclosure, and the same or similar constituent elements will be designated by the same reference numerals throughout the specification. Therefore, the same reference numerals may be used in different drawings to identify the same or similar elements.

In addition, the size and thickness of each component illustrated in the drawings may be arbitrarily shown for better understanding and ease of description, and the present disclosure is not limited thereto. Thicknesses of several portions and regions may be exaggerated for clear expressions.

In description, the expression "equal" may mean "substantially equal." That is, this may mean equality to a degree to which those skilled in the art can understand the equality. Other expressions may be expressions in which "substantially' is omitted.

Figure 2:
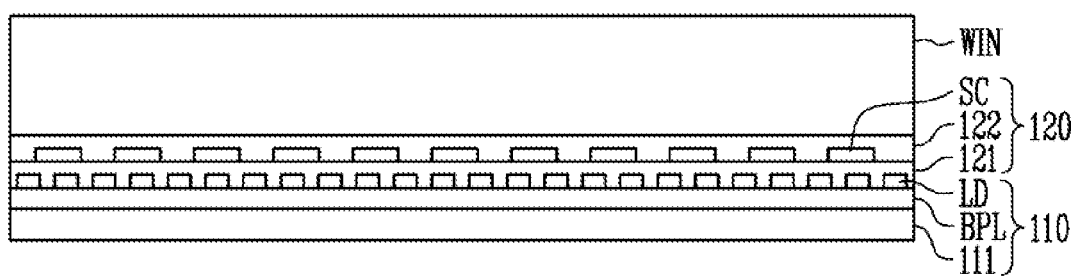

FIGS. 1 and 2 are diagrams illustrating a display device in accordance with an embodiment of the present disclosure.

Referring to FIG. 1, the display device 1 in accordance with the embodiment of the present disclosure may include a panel 10 and a driving circuit 20 for driving the panel 10.

For example, the panel 10 may include a display unit 110 for displaying an image and a sensor unit 120 (e.g., a sensor or sensing circuit) for sensing a touch, a pressure, a fingerprint, hovering, etc. For example, the panel 10 may include pixels PX and sensors SC located while overlapping with at least some of the pixels PX. In an embodiment, the sensors SC may include first sensors TX and second sensors RX. In another embodiment (e.g., a self-capacitance type), the sensors SC may be configured with one kind of sensors without distinguishing the first and second sensors from each other. The driving circuit 20 may include a display driver 210 (e.g., a driver circuit) for driving the display unit 110 and a sensor driver 220 (e.g., a driver circuit) for driving the sensor unit 120. For example, the pixels PX may display an image by using a display frame period as a unit. For example, the sensors SC may sense an input of a user by using a sensing frame period as a unit. The sensing frame period and the display frame period may be independent from each other or be different from each other. The sensing frame period and the display frame period may be synchronized with each other or be unsynchronized.

In some embodiments, after the display unit 110 and the sensor unit 120 are manufactured separately from each other, the display unit 110 and the sensor unit 120 may be disposed and/or coupled to overlap with each other in at least one area. Alternatively, in another embodiment, the display unit 110 and the sensor unit 120 may be integrally manufactured. For example, the sensor unit 120 may be formed directly on at least one substrate (e.g., an upper substrate and/or a lower substrate of a display panel, or a thin film encapsulation layer), or another insulating layer or one of various types of functional layers (e.g., an optical layer or a protective layer), which constitutes the display unit 110.

Meanwhile, although a case where the sensor unit 120 is disposed on a front surface (e.g., an upper surface on which an image is displayed) of the display unit 110 is illustrated in FIG. 1, the position of the sensor unit 120 is not limited thereto. For example, in another embodiment, the sensor unit 120 may be disposed on a rear surface or both surfaces of the display unit 110. In still another embodiment, the sensor unit 120 may be disposed in at least one edge area of the display unit 110.

The display unit 110 may include a display substrate 111 and a plurality of pixels PX formed on the display substrate 111. The pixels PX may be disposed in a display area DA of the display substrate 111.

The display substrate 111 may include the display area DA in which an image is displayed and a non-display area NDA at the periphery of the display area DA. In some embodiments, the display area DA may be disposed in a central area of the display unit 110, and the non-display area NDA is disposed in an edge area of the display unit 110 to surround the display area DA.

The display substrate 111 may be a rigid substrate or a flexible substrate, and the material or property of the display substrate 111 is not particularly limited. For example, the display substrate 111 may be a rigid substrate made of glass or tempered glass, or a flexible substrate configured with a thin film made of plastic or metal.

Scan lines SL and data lines DL, and the pixels PX connected to the scan lines SL and the data lines DL are disposed in the display area DA. Pixels PX are selected by a scan signal having a turn-on level, which is supplied from the scan lines SL, to be supplied with a data signal from the data lines DL, and emit light with a luminance corresponding to the data signal. Accordingly, an image corresponding to the data signal is displayed in the display area DA. In the present disclosure, the structure, driving method, and the like of the pixels PX are not particularly limited. For example, each of the pixels PX may be implemented as a pixel having various structures and/or various driving methods.

Various types of lines and/or a built-in circuit, connected to the pixels PX of the display area DA may be disposed in the non-display area NDA. In an example, a plurality of lines for supplying various power sources and various control signals to the display area DA may be disposed in the non-display area NDA. In addition, a scan driver and the like may be further disposed in the non-display area NDA. For example, the scan driver may supply the scan signals.

In the present disclosure, the kind of the display unit 110 is not particularly limited. For example, the display unit 110 may be implemented as a self-luminescent display panel such as an organic light emitting display panel. However, when the display unit 110 is implemented as a self-luminescent display panel, each pixel is not necessarily limited to a case where the pixel includes only an organic light emitting element. For example, a light emitting element of each pixel may be configured as an organic light emitting diode, an inorganic light emitting diode, a quantum dot/well light emitting diode, etc. A plurality of light emitting elements may be provided in each pixel. The plurality of light emitting elements may be connected in series, parallel, series/parallel, etc. Alternatively, the display unit 110 may be implemented as a non-light emitting display panel such as a liquid crystal display panel. When the display unit 110 is implemented as a non-light emitting display panel, the display device 1 may additionally include a light source such as a back-light unit.

The sensor unit 120 may include a sensor substrate 121 and a plurality of sensors SC formed on the sensor substrate 121. The sensors SC may be disposed in a sensing area SA on the sensor substrate 121.

The sensor substrate 121 may include the sensing area SA capable of sensing a touch input or the like and a peripheral area NSA at the periphery of the sensing area SA. In some embodiments, the sensing area SA may be disposed to overlap with at least one area of the display area DA. In an example, the sensing area SA may be set as an area corresponding to the display area DA (e.g., an area overlapping with the display area DA), and the peripheral area NSA may be set as an area corresponding to the non-display area NDA (e.g., an area overlapping with the non-display area NDA). When a touch input or the like is applied to the display area DA, the touch input may be detected through the sensor unit 120.

The sensor substrate 121 may be a rigid or flexible substrate. In addition, the sensor substrate 121 may be configured with at least one insulating layer. Also, the sensor substrate 121 may be a transparent or translucent light transmission substrate, but the present disclosure is not limited thereto. That is, in the present disclosure, the material and property of the sensor substrate 121 are not particularly limited. For example, the sensor substrate 121 may be a rigid substrate configured with glass or tempered glass, or a flexible substrate configured with a thin film made of plastic or metal. In some embodiments, at least one substrate (e.g., the display substrate 111, an encapsulation substrate, and/or a thin film encapsulation layer) constituting the display unit 110 or, at least one insulating layer or at least one functional layer, disposed at the inside and/or an outer surface of the display 110 may be used as the sensor substrate 121.

The sensing area SA is set as an area capable of reacting with a touch input (i.e., an active area of sensors). To this end, sensors SC for sensing a touch input or the like may be disposed in the sensing area SA. In some embodiments, the sensors SC may include first sensors TX and second sensors RX. For example, the first sensors TX may be transmitting electrodes and the second sensors RX may be receiving electrodes but are not limited thereto.

For example, each of the first sensors TX may extend in a first direction DR1. The first sensors TX may be arranged in a second direction DR2. The second direction DR2 may be different from the first direction DR1. For example, the second direction DR2 may be a direction orthogonal to the first direction DR1. In another embodiment, the extending direction and arrangement direction of the first sensors TX may follow another conventional configuration. Each of the first sensors TX may have a form in which first cells having a relatively wide area and first bridges having a relatively narrow area are connected to each other. For example, the first cells may be connected to one another using the first bridges. Although a case where each of the first cells has a diamond shape is illustrated in FIG. 1, each of the first cells may be configured with various other shapes including a circular shape, a quadrangular shape, a triangular shape, a mesh shape, and the like. For example, the first bridges may be integrally formed with the first cells on the same layer. In another embodiment, the first bridges may be formed in a layer different from that of the first cells, to electrically connect adjacent first cells to each other.

For example, each of the second sensors RX may extend in the second direction DR2. The second sensors RX may be arranged in the first direction DR1. In another embodiment, the extending direction and arrangement direction of the second sensors RX may follow another configuration. Each of the second sensors RX may have a form in which second cells having a relatively wide area and second bridges having a relatively narrow area are connected to each other. Although a case where each of the second cells has a diamond shape is illustrated in FIG. 1, each of the first cells may be configured with various conventional shapes including a circular shape, a quadrangular shape, a triangular shape, a mesh shape, and the like. For example, the second bridges may be integrally formed with the second cells on the same layer. In another embodiment, the second bridges may be formed in a layer different from that of the second cells, to electrically connect adjacent second cells to each other.

In some embodiments, each of the first sensors TX and the second sensors RX may include at least one of a metal material, a transparent conductive material, and various other conductive materials, thereby having conductivity. In an example, the first sensors TX and the second sensors RX may include at least one of various metal materials including gold (Au), silver (Ag), aluminum (Al), molybdenum (Mo), chromium (Cr), titanium (Ti), nickel (Ni), neodymium (Nd), copper (Cu), platinum (Pt), and the like, or alloys thereof. The first sensors TX and the second sensors RX may be configured to have a mesh shape. Also, the first sensors TX and the second sensors RX may include at least one of various transparent conductive materials including silver nano wire (AgNW), Indium Tin Oxide (ITO), Indium Zinc Oxide (IZO), Indium Gallium Zinc Oxide (IGZO), Antimony Zinc Oxide (AZO), Indium Tin Zinc Oxide (ITZO), Zinc Oxide (ZnO), Tin Oxide ($SnO_2$), carbon nano tube, graphene, and the like. In addition, the first sensors TX and the second sensors RX may include at least one of various conductive materials, thereby having conductivity. Also, each of the first sensors TX and the second sensors RX may be configured as a single layer or a multi-layer, and its sectional structure is not particularly limited.

Meanwhile, sensor lines for electrically connecting the sensors SC to the sensor driver 220, and the like may be concentrically disposed in the peripheral area NSA.

The driving circuit 20 may include the display driver 210 for driving the display unit 110 and the sensor driver 220 for driving the sensor unit 120. In an embodiment, the display driver 210 and the sensor driver 220 may be configured as Integrated Chips (ICs) separate from each other. In another embodiment, at least a portion of the display driver 210 and at least a portion of the sensor driver 220 may be integrated together in one IC.

The display driver 210 is electrically connected to the display unit 110 to drive the pixels PX. For example, the display device 210 may include a data driver and a timing controller (e.g., a control circuit), and a scan driver may be separately mounted in the non-display area NDA of the display unit 110. In another embodiment, the display driver 210 may include the whole or at least a portion of the data driver, the timing controller, and the scan driver. In another embodiment, the display driver 210 may correspond to at least one of a Graphic Processing Unit (GPU), a Central Processing Unit (CPU), an Application Processor (AP), and the like. In another embodiment, the display driver 210 may be at least one of the GPU, the CPU, and the AP and the timing controller.

The sensor driver 220 is electrically connected to the sensor unit 120 to drive the sensor unit 120. The sensor driver 220 may include a sensor transmitter and a sensor receiver. In some embodiments, the sensor transmitter and the sensor receiver may be integrated in one IC, but the present disclosure is not limited thereto.

Referring to FIG. 2, for example, the sensor unit 120 may be stacked on the top of the display unit 110, and a window WIN may be stacked on the top of the sensor unit 120.

The display unit 110 may include a display substrate 111, a circuit element layer BPL formed on the display substrate 111, and light emitting elements LD formed on the circuit element layer BPL. The circuit element layer BPL may include pixel circuits for driving light emitting elements LD of pixels PX, scan lines SL, data lines DL, and the like.

The sensor unit 120 may include a sensor substrate 121, sensors SC formed on the sensor substrate 121, and a protective layer 122 covering the sensors SC. In the embodiment shown in FIG. 2, the sensor substrate 121 may be illustrated in the form of an encapsulation layer covering the pixels PX. In another embodiment, the sensor substrate 121 may exist separately from the encapsulation layer covering the pixels PX.

The window WIN is a protective member disposed at the uppermost end of the module of the display device 1, and may be substantially a transparent light transmission substrate. The window WIN may have a multi-layered structure selected from a glass substrate, a plastic film, and a plastic substrate. The window WIN may include a rigid or flexible material, but the material constituting the window WIN is not particularly limited.

Although not shown in the drawing, the display device 1 may further include a polarizing plate (or another kind of anti-reflection layer) for preventing reflection of external light between the window WIN and the sensor unit 120.

Figure 3:
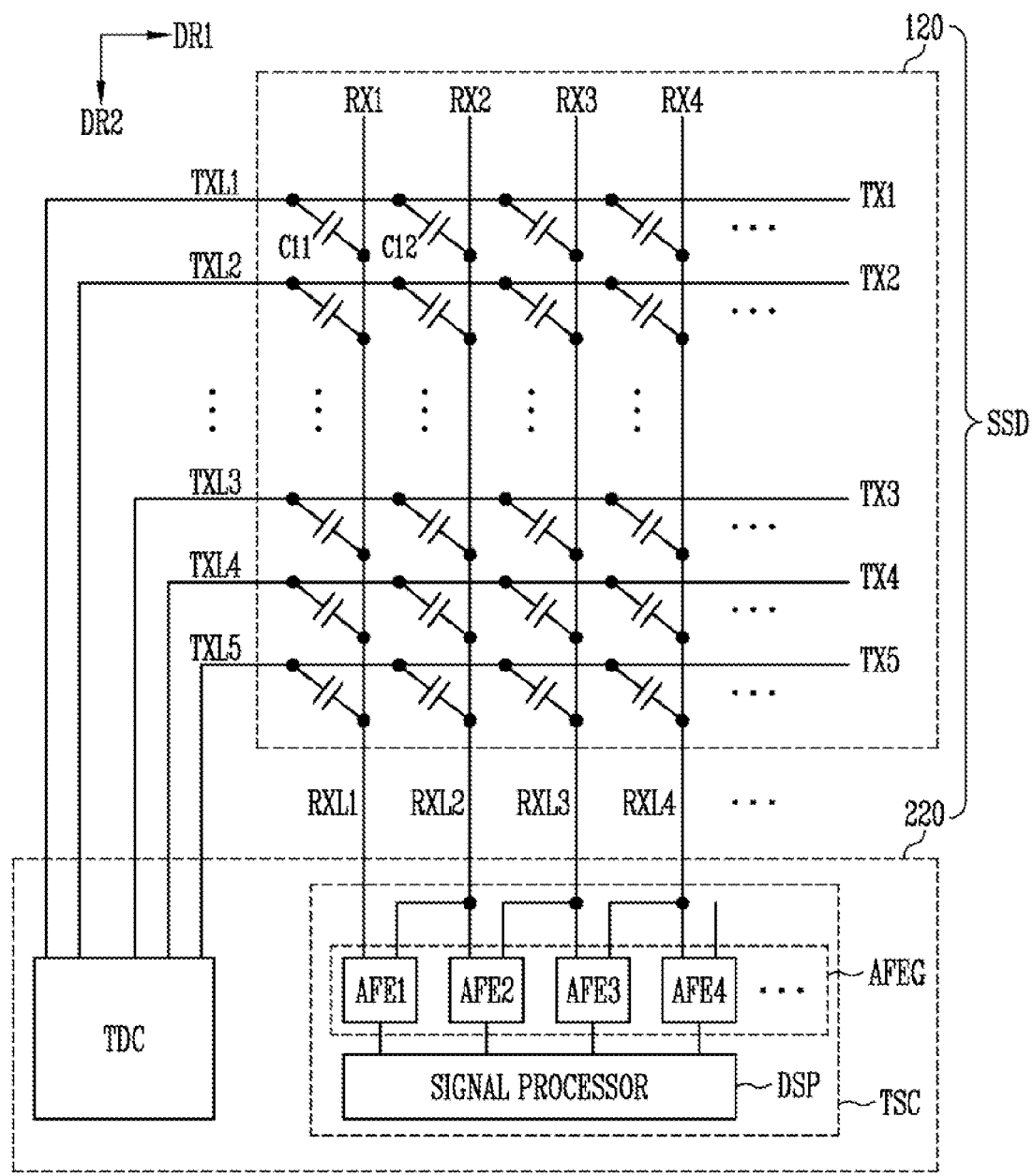
FIG. 3 is a diagram illustrating a sensor device in accordance with an embodiment of the present disclosure.

FIG. 3 is a diagram illustrating a sensor device in accordance with an embodiment of the present disclosure.

Referring to FIG. 3, the sensor device SSD in accordance with the embodiment of the present disclosure may include a sensor unit 120 and a sensor driver 220. The sensor device SSD may be included in the display device 1. Meanwhile, the sensor device SSD may be configured as a separate independent product, regardless of the display device 1.

The sensor unit 120 may include first sensors TX1, TX2, TX3, TX4, and TX5 and second sensors RX1, RX2, RX3, and RX4. The first sensors TX1 to TX5 may extend in the first direction DR1, and be arranged in the second direction DR2. The second sensors RX1 to RX4 may extend in the second direction DR2, and be arranged in the first direction DR1. The second sensors RX1 to RX4 may intersect the first sensors TX1 to TX5. The first sensors TX1 to TX5 and the second sensors RX1 to RX4 may form a mutual capacitance. For example, a capacitance C11 may be formed between a first sensor TX1 and a second sensor RX1, and a capacitance C12 may be formed between the first sensor TX1 and a second sensor RX2. The sensor driver 220 may sense a change in the capacitances C11 and C12, thereby determining whether a touch of a user has been input, etc.

The sensor driver 220 may include a sensor transmitter TDC and a sensor receiver TSC. The sensor transmitter TDC may be connected to the first sensors TX1 to TX5, and supply driving signals to the first sensors TX1 to TX5. The sensor transmitter TDC may be connected to the first sensors TX1 to TX5 through first sensor lines TXL1, TXL2, TXL3, TXL4, and TXL5.

The sensor receiver TSC may be connected to the second sensors RX1 to RX4, and receive sensing signals from the second sensors RX1 to RX4. The sensor receiver TSC may be connected to the second sensors RX1 to RX4 through second sensor lines RXL1, RXL2, RXL3, and RXL4. The sensor receiver TSC may include an analog front end group AFEG and a signal processor DSP. For example, the signal processor DSP may be a digital signal processor.

The analog front end group AFEG may include a plurality of analog front ends AFE1, AFE2, AFE3, and AFE4. Each of the analog front ends AFE1, AFE2, AFE3, and AFE4 may be connected to two adjacent second sensors among the second sensors RX1 to RX4. For example, a first analog front end AFE1 may be connected to the second sensor RX1 and the second sensor RX2. A second analog front end AFE2 may be connected to the second sensor RX2 and a second sensor RX3. A third analog front end AFE3 may be connected to the second sensor RX3 and the second sensor RX4. A fourth analog front end AFE4 may be connected to the second sensor RX4 and another second sensor (not shown). Each of the analog front ends AFE1, AFE2, AFE3, and AFE4 generates a digital signal from which a common noise is removed by using sensing signals of adjacent sensor sensors as differential signals, so that a Signal to Noise Ratio (SNR) can be increased.

The signal processor DSP may calculate sensing values by using digital signals provided from the analog front end group AFEG. For example, a digital signal provided from the first analog front end AFE1 may correspond to a difference between a level Iv2 of a sensing signal of the second sensor RX2 and a level Iv1 of a sensing signal of the second sensor RX1 (Iv2−Iv1). A digital signal provided from the second analog front end AFE2 may correspond to a difference between a level Iv3 of a sensing signal of the second sensor RX3 and the level Iv2 of the sensing signal of the second sensor RX2 (Iv3−Iv2). A digital signal provided from the third analog front end AFE3 may correspond to a difference between a level Iv4 of a sensing signal of the second sensor RX4 and the level Iv3 of the sensing signal of the second sensor RX3 (Iv4−Iv3).

For example, the signal processor DSP may calculate a relative level Iv2' of the sensing signal of the second sensor RX2, a relative level Iv3' of the sensing signal of the second sensor RX3, and a relative level Iv4' of the sensing signal of the second sensor RX4, by using the following Equation 1 to Equation 3.

$$Iv2'=Iv2-Iv1=(Iv2-Iv1) \quad \text{[Equation 1]}$$

$$Iv3'=Iv3-Iv1=(Iv3-Iv2)+(Iv2-Iv1) \quad \text{[Equation 2]}$$

$$Iv4'=Iv4-Iv1=(Iv4-Iv3)+(Iv3-Iv2)+(Iv2-Iv1) \quad \text{[Equation 3]}$$

The signal processor DSP may determine whether a touch of a user has been input, etc. by using the levels Iv2', Iv3', and Iv4' as sensing values, or transfer the sensing values to the display driver 210.

Figure 4:
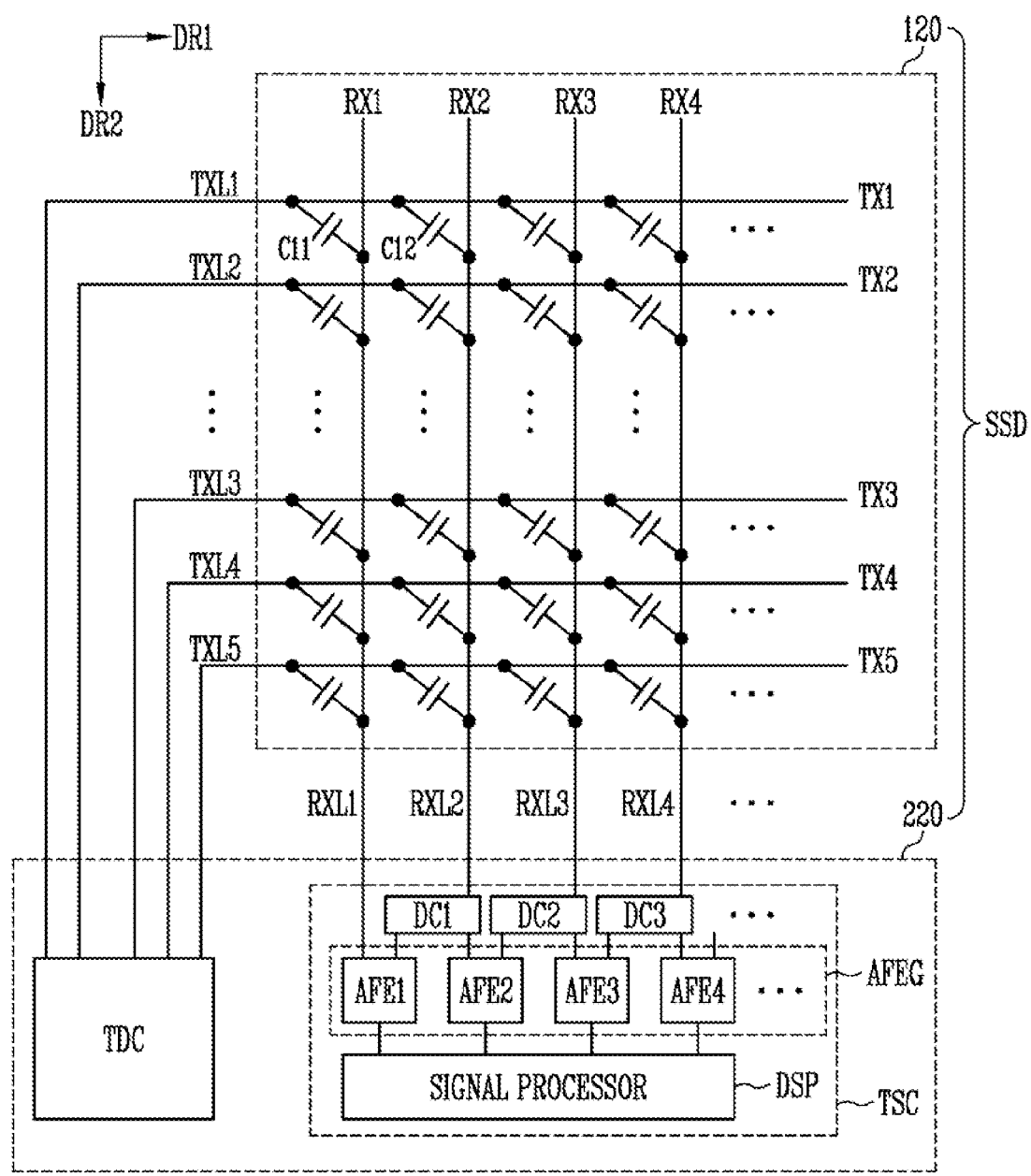
FIG. 4 is a diagram illustrating a sensor device in accordance with an embodiment of the present disclosure.

FIG. 4 is a diagram illustrating a sensor device in accordance with an embodiment of the present disclosure.

A sensor receiver TSC shown in FIG. 4 is different from the sensor receiver TSC shown in FIG. 3, in that the sensor receiver TSC shown in FIG. 4 further includes distribution circuits DC1, DC2, and DC3.

The distribution circuits DC1, DC2, and DC3 may be disposed between at least some of second sensors RX1 to RX4 and analog front ends AFE1 to AFE4, generate a plurality of signals having the same magnitude (e.g., the same voltage level or the same current amount), based on each of sensing signals provided from the at least some of the second sensors RX1 to RX4, and distribute the generated signals to the analog front ends AFE1 to AFE4. For example, the distribution circuits DC1, DC2, and DC3 may be configured to include an amplifier, a buffer, and the like, and amplify or mirror each of the sensing signals, thereby outputting the amplified or mirrored sensing signal.

For example, a first distribution circuit DC1 may receive a second sensing signal provided from a second sensor RX2, and provide signals having the same magnitude as the second sensing signal respectively to a first analog front end AFE1 and a second analog front end AFE2. When the second sensing signal does not pass through the first distribution circuit DC1, the second sensing signal may be simultaneously supplied to the first analog front end AFE1 and the second analog front end AFE2. Therefore, a magnitude of the second sensing signal may be different from that of a first sensing signal received from a second sensor RX1 due to a relative increase in load with respect to the second sensing signal. For example, the magnitude of the second sensing signal may be smaller than that of the first sensing signal. Therefore, in this embodiment, signals having the same magnitude as the second sensing signal may be respectively provided to the first analog front end AFE1 and the second analog front end AFE2 by using the first distribution circuit DC1.

Similarly, a second distribution circuit DC2 may receive a third sensing signal provided from a second sensor RX3, and provide signals having the same magnitude as the third sensing signal respectively to the second analog front end AFE2 and a third analog front end AFE3. A third distribution circuit DC3 may receive a fourth sensing signal provided from a second sensor RX4, and provide signals having the same magnitude as the fourth sensing signal respectively to the third analog front end AFE3 and a fourth analog front end AFE4.

Figure 5:
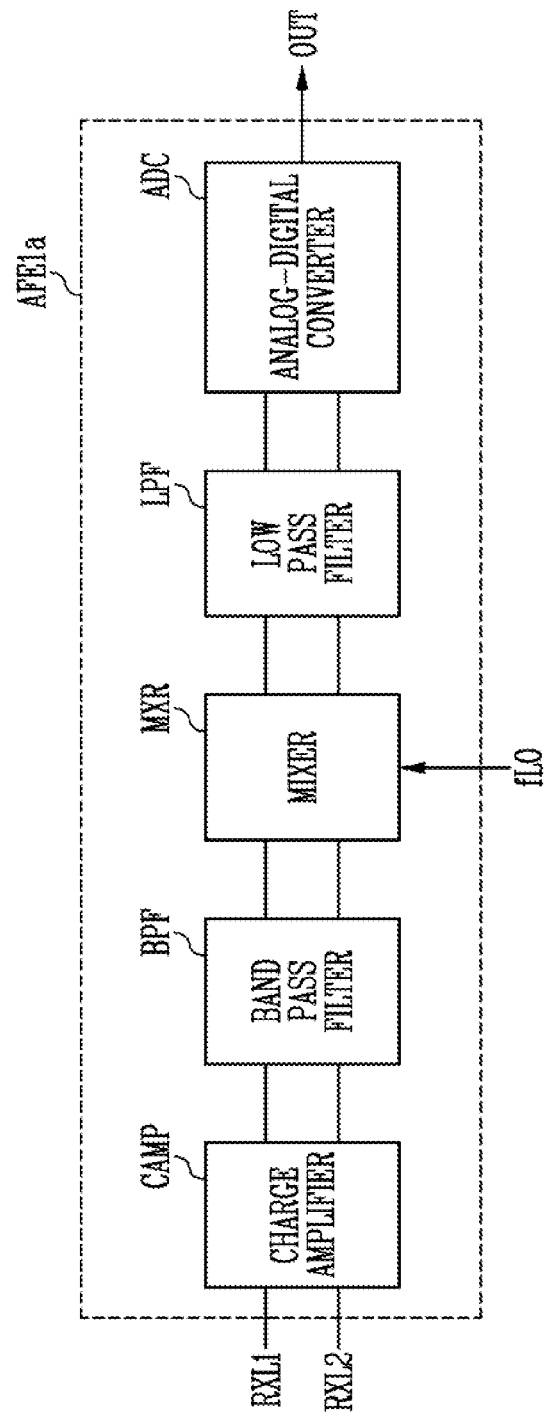
FIG. 5 is a diagram illustrating an analog front end in accordance with an embodiment of the present disclosure.

FIG. 5 is a diagram illustrating an analog front end in accordance with an embodiment of the present disclosure.

Referring to FIG. 5, a first analog front end AFE1*a* in accordance with an embodiment of the present disclosure may include a charge amplifier CAMP, a band pass filter BPF, a mixer MXR, a low pass filter LPF, and an analog-to-digital converter ADC. The other analog front ends AFE2, AFE3, and AFE4 may have the same configuration as the first analog front end AFE1*a*, except only second sensors connected thereto, and therefore, overlapping descriptions will be omitted (see FIGS. 3 and 4). In an embodiment, the band pass filter BPF passes frequencies within a certain range and rejects or attenuates frequencies outside that range.

The charge amplifier CAMP may receive sensing signals from two sensors RX1 and RX2 among the second sensors RX1 to RX4. For example, a first input terminal (e.g., non-inverting terminal) of the charge amplifier CAMP may be connected to the second sensor line RXL2, and a second input terminal (e.g., an inverting terminal) of the charge amplifier CAMP may be connected to the second sensor line RXL1. Therefore, the charge amplifier CAMP may output a signal corresponding to a difference of a level of a sensing signal of the second sensor RX2 and a level of a sensing signal of the second sensor RX1. The charge amplifier CAMP may be configured as a fully differential amplifier, to output the signal corresponding to the difference between the level of the sensing signal of the second sensor RX2 and the level of the sensing signal of the second sensor RX1 and an inverted signal thereof. In FIG. 5, two internal signal lines are illustrated in parallel by assuming that the elements BPF, MXR, LPF, and ADC connected to an output terminal of the charge amplifier CAMP have a specification requiring an input signal and an inverted input signal. For example, the input signal and an inverted input signal may be differential signals. Each of the elements BPF, MXR, LPF, and ADC can remove common mode noise by using the input signal and the inverted input signal. In an embodiment, the charge amplifier is implemented by an electronic current integrator that produces a voltage output proportional to the integrated value of the input current.

However, in another embodiment, the elements BPF, MXR, LPF, and ADC may be configured with a specification requiring only the input signal without the inverted input signal. The output terminal of the charge amplifier CAMP may be configured as a single-ended terminal, to output only the signal corresponding to the difference between the level of the sensing signal of the second sensor RX2 and the level of the sensing signal of the second sensor RX1. In this embodiment, one internal signal line connecting the charge amplifier CAMP and each of the elements BPF, MXR, LPF, and ADC to each other may be illustrated.

The band pass filter BPF may be connected to the output terminal of the charge amplifier CAMP. The band pass filter BPF may filter an output signal of the charge amplifier CAMP to have a set frequency band. For example, a frequency band or pass band may be predetermined to include a frequency (or central frequency) of sensing signals, and noise components may be located outside of the frequency band. The central frequency of the sensing signals may be the same as that of driving signals.

The mixer MXR may mix an output signal of the band pass filter BPF and a local clock signal fLO. The mixer MXR may include frequency components corresponding to a difference and a sum of a frequency of the output signal of the band pass filter BPF and a frequency of the local clock signal fLO. For example, when the frequency of the output signal of the band pass filter BPF and the frequency of the local clock signal fLO are the same, an output signal of the mixer MXR may include a frequency component having 0 Hz as the central frequency. In an embodiment, the mixer MXR is a frequency mixer. In an embodiment, the mixer MXR is an nonlinear electrical circuit that creates a signal with new frequency from two input signals.

The low pass filter LPF may filter the output signal of the mixer MXR to have a set frequency band. The set frequency band of the low pass filter LPF may be lower than that of the band pass filter LPF. For example, the low pass filter LPF may allow only a signal of a low frequency band having 0 Hz as the central frequency in the output signal of the mixer MXR to pass therethrough. Accordingly, the low pass filter LPF can filter frequency components corresponding to noise. In an embodiment, the low pass filter LPF passes signals with a frequency lower than a selected cutoff frequency and attenuates signals with frequencies higher than the selected cutoff frequency.

The analog-to-digital converter ADC may convert an output of the low pass filter LPF into a digital signal OUT. Since the analog-to-digital converter ADC receives the signal of the low frequency band from the low pass filter LPF, the analog-to-digital converter ADC can operate at a small sampling rate, and the frequency of a clock signal can be low. Accordingly, the analog-to-digital converter ADC may reduce power cost and configuration cost.

The signal processor DSP may determine final sensing values by using a digital signal OUT output from each of the analog front ends AFE1, AFE2, AFE3, and AFE4 (see FIG. 3 and Equations 1 to 3).

FIGS. 6 to 11 are diagrams illustrating a band pass filter in accordance with an embodiment of the present disclosure.

Figure 6:
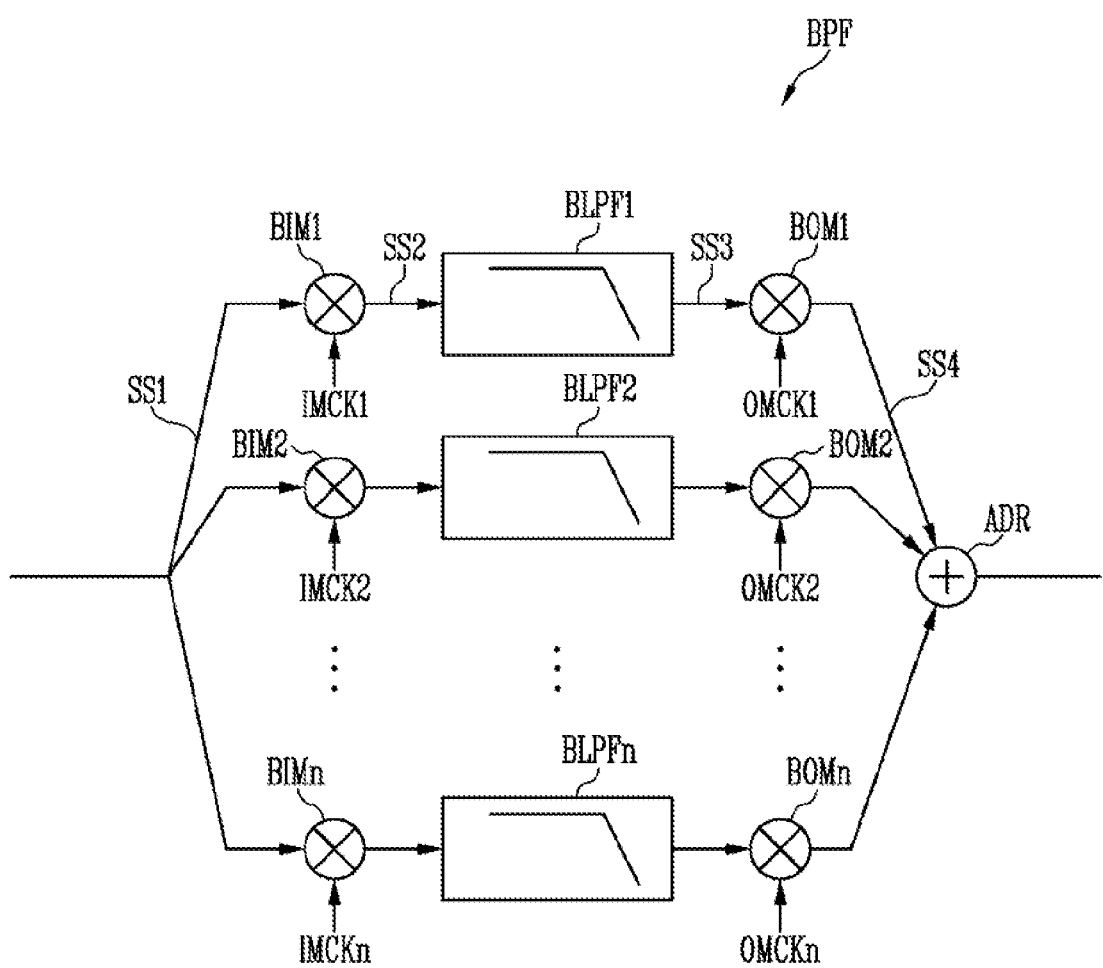
FIGS. 6 to 11 are diagrams illustrating a band pass filter in accordance with an embodiment of the present disclosure.

Referring to FIG. 6, the band pass filter BPF in accordance with the embodiment of the present disclosure may include a plurality of paths connected in parallel. The plurality of paths may receive the same input signals SS1. Output signals SS4 of the plurality of paths may be added in an adder ADR (or be synthesized). The adder ADR need not be a distinct element (e.g., an adder circuit), but may be an electrical node to which the output signals SS4 of the plurality of paths are commonly applied.

A first path may sequentially include a first input mixer BIM1, a first filter BLPF1, and a first output mixer BOM1. A second path may sequentially include a second input mixer BIM2, a second filter BLPF2, and a second output mixer BOM2. An nth path may sequentially include an nth input mixer BIMn, an nth filter BLPFn, and an nth output mixer BOMn.

In FIG. 6, it is assumed that the number of the plurality of paths is n. Here, n may be an integer greater than 0. A target signal may be amplified as the n becomes larger (e.g., a Q factor increases). However, when the number of paths is too large, harmonic components are also amplified, and therefore, it is necessary to set the n to an appropriate number. In an embodiment, the n is set to 4 or 8.

A frequency and a phase of a first input clock signal IMCK1 received by the first input mixer BIM1 may be equal to those of a first output clock signal OMCK1 received by the first output mixer BOM1. A frequency and a phase of a second input clock signal IMCK2 received by the second input mixer BIM2 may be equal to those of a second output clock signal OMCK2 received by the second output mixer BOM2. A frequency and a phase of an nth input clock signal IMCKn received by the nth input mixer BIMn may be equal to those of an nth output clock signal OMCKn received by the nth output mixer BOMn.

Figure 7:
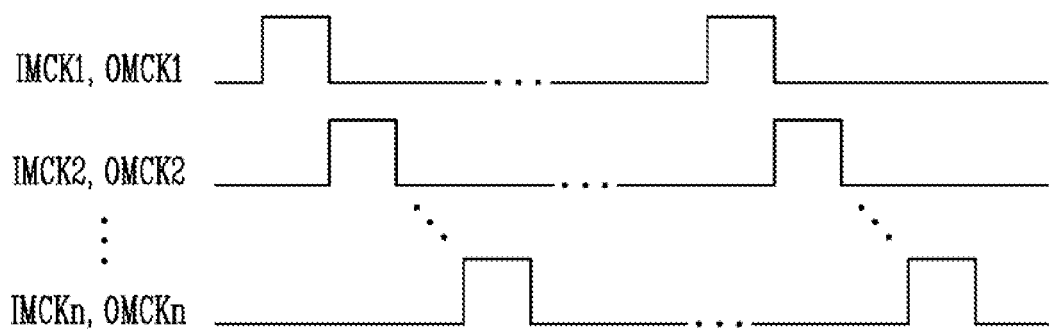

Referring to FIG. 7, the frequencies of the input clock signals IMCK1, IMCK2, and IMCKn may be equal to one another, and the phases of the input clock signals IMCK1, IMCK2, and IMCKn may be different from one another. For example, the frequency of the first input clock signal IMCK1 may be equal to that of the second input clock signal IMCK2, and the phase of the first input clock signal IMCK1 may be different from that of the second input clock signal IMCK2. Accordingly, frequency components at different times are added in the adder ADR, and thus the dependence/sensitivity with respect to a specific time can be decreased.

Figure 8:
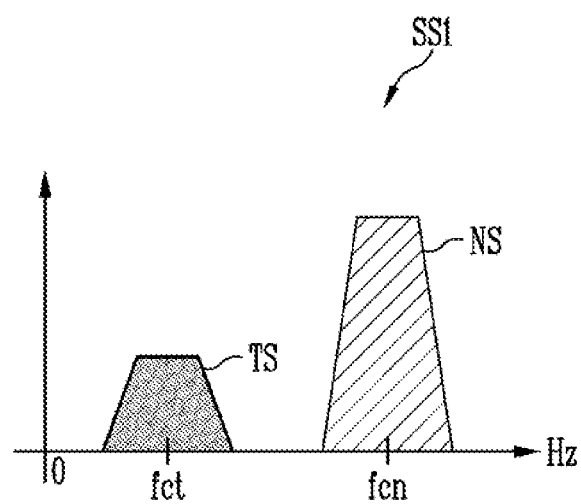

Referring to FIG. 8, frequency components TS and NS of the input signal SS1 are exemplarily illustrated. The horizontal axis of a graph indicates frequency, and the vertical axis of the graph indicates magnitude of a signal. It is assumed that a frequency component TS is a frequency component including meaningful information having a frequency fct of a driving signal as a central frequency. It is assumed that a frequency component NS is a noise component having an arbitrary frequency fcn as a central frequency.

Figure 9:
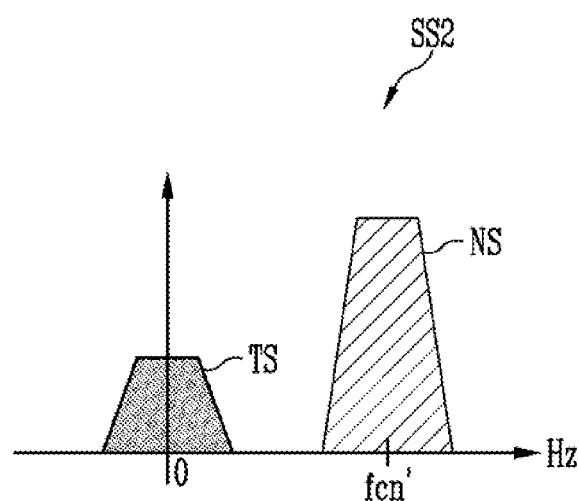

The first input mixer BIM1 may output frequency components corresponding to a difference and a sum of a frequency fct of the first input clock signal IMCK1 and a frequency of the input signal SS1 (i.e., a frequency of driving signals). Referring to FIG. 9, an output signal SS2 of the first input mixer BIM1 is partially illustrated. For example, frequency components TS and NS corresponding to the difference of the frequency fct of the first input clock signal IMCK1 and the frequency of the input signal SS1 are exemplarily illustrated.

Frequencies fct of the input clock signals IMCK1, IMCK2, and IMCKn may be equal to frequencies fct of driving signals transmitted from the sensor transmitter TDC. For example, the frequency fct of the first input clock signal IMCK1 may be equal to frequencies fct of the driving signals. Therefore, a central frequency of the frequency component TS may be 0 Hz (0=fct-fct). A central frequency of the frequency component NS may be an arbitrary frequency (fcn'=fcn-fct), and need not be 0 Hz (see FIG. 9).

Figure 10:
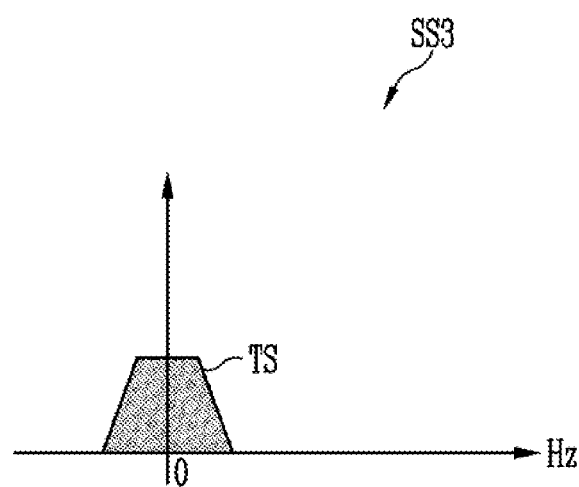
Figure 11:
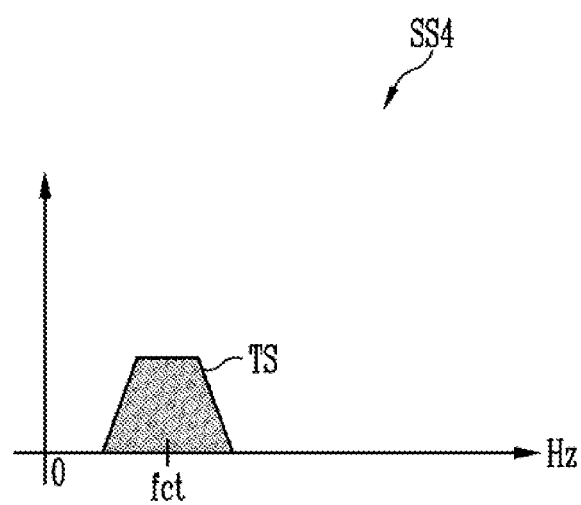

A central frequency of a passband of the first filter BLPF1 may be set as a difference (i.e., 0 Hz) or a sum (i.e., 2 fct) of the frequency fct of the first input clock signal IMCK1 and the frequency fct of the driving signals. Referring to FIG. 10, a case where the central frequency of the passband of the first filter BLPF1 is set the difference (i.e., 0 Hz) of the frequency fct of the first input clock signal IMCK1 and the frequency fct of the driving signals is exemplarily illustrated. That is, the first filter BLPF1 may be set as a low pass filter having 0 Hz as a central frequency. Therefore, an output signal SS3 of the first filter BLPF1 includes only the frequency component TS including the meaningful information, and may not include the frequency component NS as the noise component.

The first output mixer BOM1 may output a frequency component corresponding to a difference (i.e., (−)fct) and a sum (i.e., fct) of a frequency fct of the first output clock signal OMCK1 and a frequency (i.e., 0 Hz) of the input signal SS3. For example, the frequency fct of the first output clock signal OMCK1 may be equal to a frequency fct of the first input clock signal IMCK1. As described above, a central frequency of a frequency component TS of the input signal SS3 may be 0 Hz. Therefore, the frequency component TS having, as a central frequency, a frequency fct corresponding to a sum of the frequency fct of the first output clock signal OMCK1 and the frequency (i.e., 0 Hz) of the input signal SS3 may be output.

Referring to FIGS. 8 to 11, it can be seen that the meaningful frequency component TS passes without any change in central frequency and the meaningless frequency component NS is removed. That is, the first path may operate as a band pass filter having a frequency fct as a central frequency. Each of the other paths operates as a band pass filter having a frequency fct as a central frequency, and therefore, overlapping descriptions will be omitted.

In accordance with an embodiment, the band pass filter BPF can be implemented without using any OP-amp. Thus, the size and power consumption of the band pass filter BPF can be decreased. Further, the frequency of the clock signals IMCK1, IMCK2, IMCKn, OMCK1, OMCK2, and OMCKn are set as a central frequency of the band pass filter BPF, and thus the central frequency and Q factor of the band pass filter BPF can be stably maintained without being influenced by a temperature, a manufacturing process, a supply voltage of a power supply, and the like.

Figure 12:
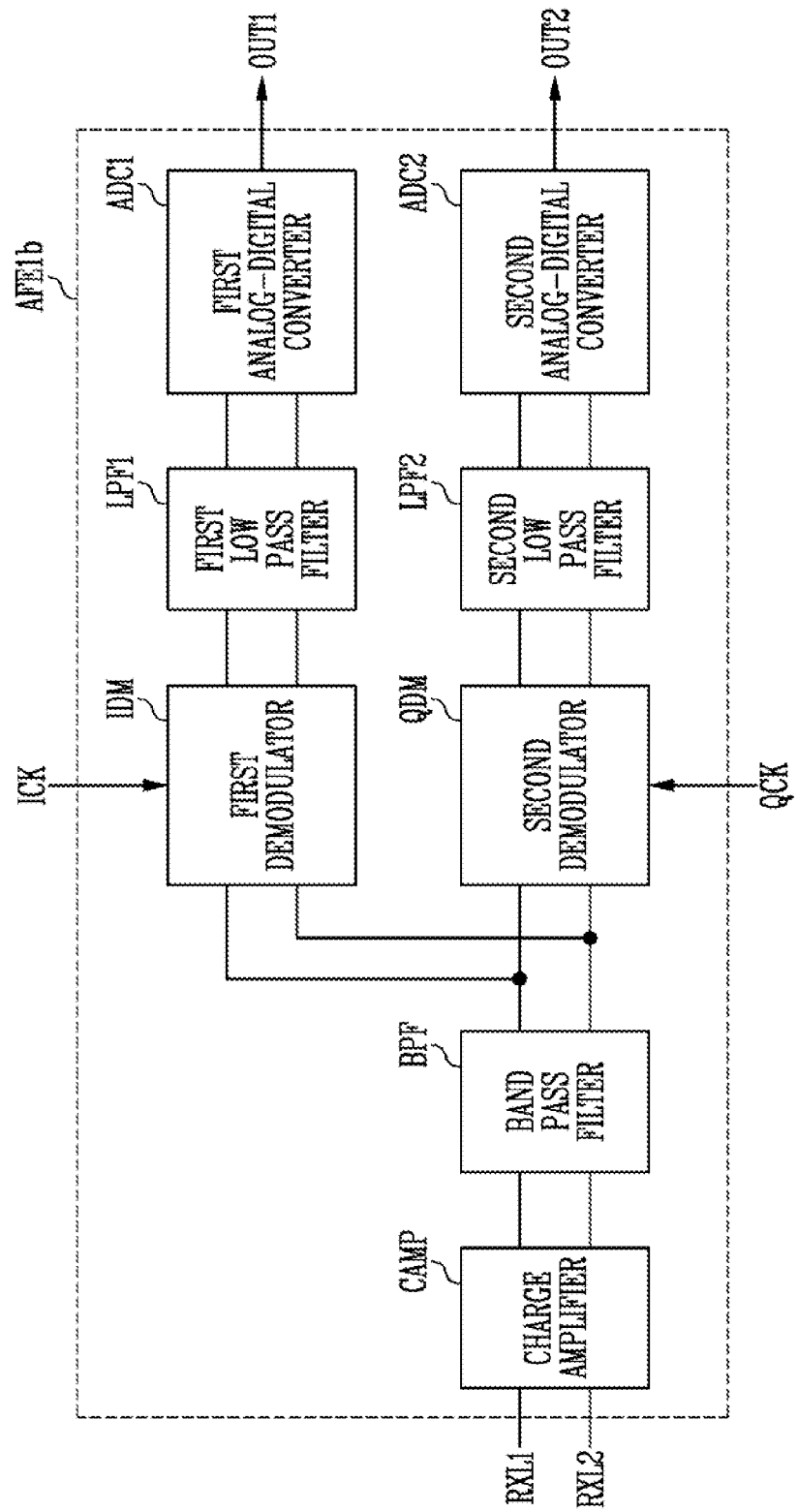
FIG. 12 is a diagram illustrating an analog front end in accordance with an embodiment of the present disclosure.

FIG. 12 is a diagram illustrating an analog front end in accordance with an embodiment of the present disclosure.

Referring to FIG. 12, a first analog front end AFE1$b$ in accordance with an embodiment of the present disclosure may include a charge amplifier CAMP, a band pass filter BPF, a first demodulator IDM, a first low pass filter LPF1, a first analog-to-digital converter ADC1, a second demodulator QDM, a second low pass filter LPF2, and a second analog-digital converter ADC2. The charge amplifier CAMP and the band pass filter are the same as described in the first analog front end AFE1$a$ shown in FIG. 5, and therefore, overlapping descriptions will be omitted.

The first demodulator IDM may demodulate an output signal of the band pass filter BPF, based on a first demodulation clock signal ICK. In addition the second demodulator QDM may demodulate the output signal of the band pass filter BPF, based on a second demodulation clock signal QCK. For example, the first demodulator IDM may be an In-phase (I) demodulator, and the second demodulator QDM may be a Quadrature (Q) demodulator. That is, the first demodulator IDM and the second demodulator QDM may be configured to perform IQ demodulation. The second demodulation clock signal QCK may have a frequency equal to that of the first demodulation clock signal ICK and but have a phase different by 90 degrees from that of the first demodulation clock signal ICK. For example, the second demodulation clock signal QCK may have a phase delayed by 90 degrees from that of the first demodulation clock signal ICK.

The first demodulator IDM may be a mixer. For example, a frequency (or central frequency of an interest band) of the first demodulation clock signal ICK may be set equal to that (or central frequency of an interest band) of the output signal of the band pass filter BPF. According to frequency mixing, an output signal of the first demodulator IDM may include a low frequency band (e.g., 0 Hz as a difference between the frequency of the first demodulation clock signal ICK and the frequency of the output signal of the band pass filter BPF), a high frequency band (e.g., a sum of the frequency of the first demodulation clock signal ICK and the frequency of the output signal of the band pass filter BPF), and other harmonic components.

Similarly, the second demodulator IDM may be a mixer. For example, a frequency (or central frequency of an interest band) of the second demodulation clock signal QCK may be set equal to that (or central frequency of an interest band) of the output signal of the band pass filter BPF. According to frequency mixing, an output signal of the second demodulator QDM may include a low frequency band (e.g., 0 Hz as a difference between the frequency of the second demodulation clock signal QCK and the frequency of the output signal of the band pass filter BPF), a high frequency band (e.g., a sum of the frequency of the second demodulation clock signal QCK and the frequency of the output signal of the band pass filter BPF), and other harmonic components.

The first low pass filter LPF1 may filter the output signal of the first demodulator IDM to have a set frequency band. In an embodiment, the set frequency band of the first low pass filter LPF1 is lower than that of the band pass filter BPF. For example, the first low pass filter LPF1 may allow only a signal of a low frequency band using 0 Hz as the center in the output signal of the first demodulator IDM to pass therethrough.

The second low pass filter LPF2 may filter the output signal of the second demodulator QDM to have a set frequency band. In an embodiment, the set frequency band of the second low pass filter LPF2 is lower than the set frequency band of the band pass filter BPF. For example, the second low pass filter LPF2 may allow only a signal of a low frequency band using 0 Hz as the center in the output signal of the second demodulator QDM to pass therethrough.

The first analog-to-digital converter ADC1 may convert an output signal of the first low pass filter LPF1 into a first digital signal OUT1. Since the first analog-to-digital converter ADC1 receives the signal of the low frequency band from the first low pass filter LPF1, the first analog-to-digital converter ADC1 can operate at a low sampling rate. Since the frequency of a clock signal can be low, the first analog-to-digital converter ADC1 may reduce power consumption and configuration cost.

Similarly, the second analog-to-digital converter ADC2 may convert an output signal of the second low pass filter LPF2 into a second digital signal OUT2. Since the second analog-to-digital converter ADC2 receives the signal of the low frequency band from the second low pass filter LPF2, the second analog-to-digital converter ADC2 can operate at a low sampling rate. Since the frequency of a clock signal can be low, the second analog-to-digital converter ADC2 may reduce power consumption and configuration cost.

Meanwhile, a phase mismatch may exist between the first demodulation clock signal ICK and the output signal of the band pass filter BPF. The phase mismatch may occur due to various factors including a temperature change, a resistance-capacitance (RC) delay caused by positions of the first sensor TX and the second sensor RX, and the like. Therefore, it is difficult to check how much phases are mismatched. Similarly, a phase mismatch may exist between the second demodulation clock signal QCK and the output signal of the band pass filter BPF.

The signal processor DSP may determine a final sensing value, based on the first digital signal OUT1 and the second digital signal OUT2. For example, the signal processor DSP may determine a final sensing value by adding a square value of the first digital signal OUT1 and a square value of the second digital signal OUT2 (see Equation 4).

$$(A\sin\theta)^2 + \left(A\sin\left(\frac{\pi}{2}+\theta\right)\right)^2 = (A\sin\theta)^2 + (A\cos\theta)^2 = A^2 \quad \text{[Equation 4]}$$

$A \sin \theta$ may correspond to the I-demodulated first digital signal OUT1, and $$A\sin\left(\frac{\pi}{2}+\theta\right)$$

may correspond to the Q-demodulated second digital signal OUT2. Referring to Equation 4, it can be seen that an original amplitude A is recovered regardless of the magnitude of a phase mismatch θ.

Figure 13:
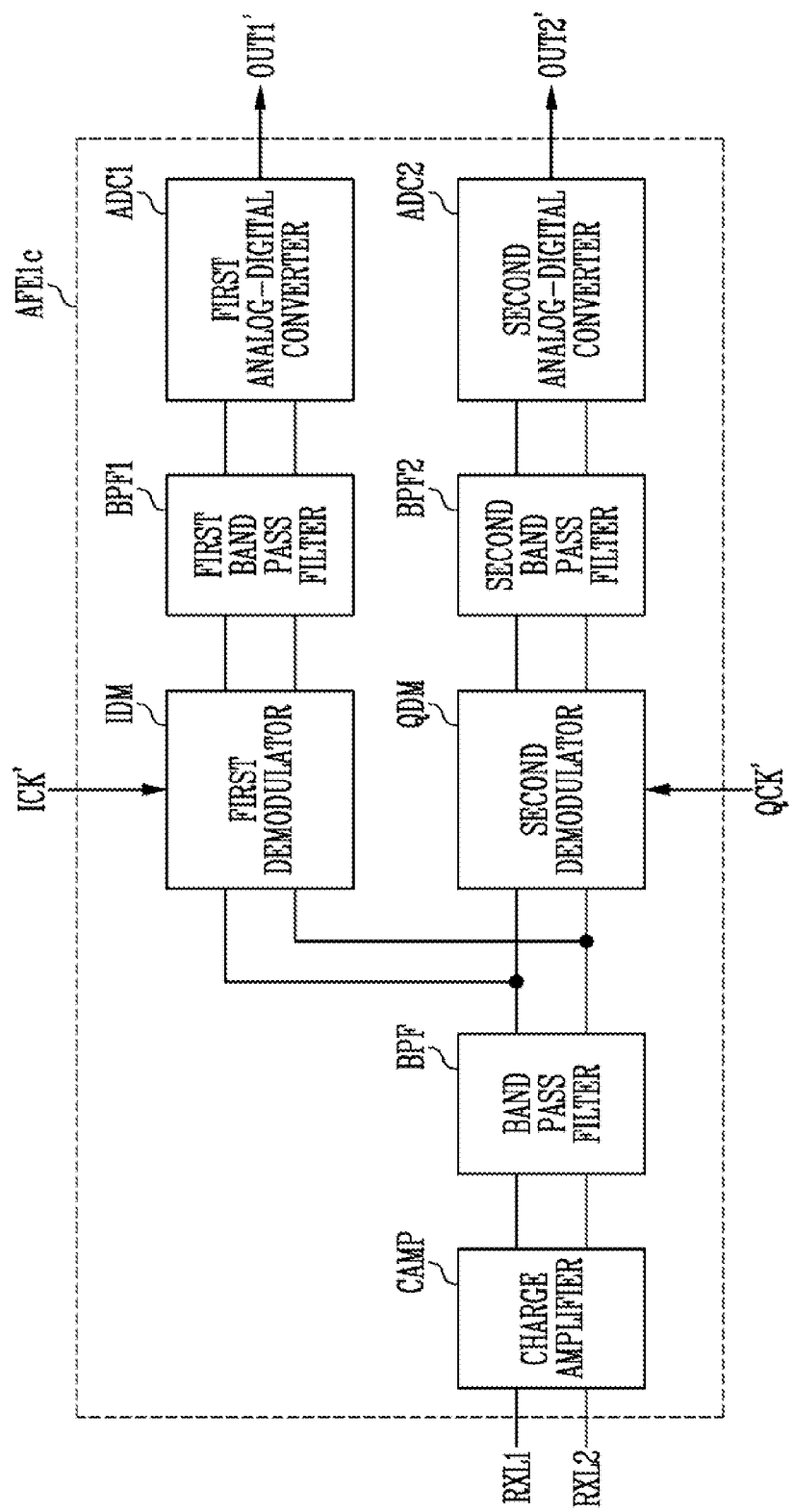
FIG. 13 is a diagram illustrating an analog front end in accordance with an embodiment of the present disclosure.

FIG. 13 is a diagram illustrating an analog front end in accordance with an embodiment of the present disclosure. A first analog front end AFE1$c$ in accordance with an embodiment of the present disclosure may include a charge amplifier CAMP, a band pass filter BPF, a first demodulator IDM, a first band pass filter BPF1, a first analog-to-digital converter ADC1, a second demodulator QDM, a second band pass filter BPF2, and a second analog digital converter ADC2.

Unlike the case shown in FIG. 12, a frequency (or central frequency of an interest band) of a first demodulation clock signal ICK' received by the first demodulation IDM and a frequency (or central frequency of an interest band) of an output signal of the band pass filter BPF may be set different from each other. Therefore, a central frequency of a low frequency band in an output signal of the first demodulation IDM need not be 0 Hz. For example, the central frequency of the low frequency band in the output signal of the first demodulator IDM may be set to a few tens to a few hundreds of kHz.

Similarly, a frequency (or central frequency of an interest band) of a second demodulation clock signal QCK' received by the second demodulation QDM and the frequency (or central frequency of the interest band) of the output signal of the band pass filter BPF may be set different from each other. Therefore, a central frequency of a low frequency band in an output signal of the second demodulation QDM need not be 0 Hz. For example, the central frequency of the low frequency band in the output signal of the second demodulator QDM may be set to a few tens to a few hundreds of kHz.

The first band pass filter BPF1 may be connected to an output terminal of the first demodulator IDM. A central frequency of a passband of the first band pass filter BPF1 may be set equal to that of the low frequency band in the output signal of the first demodulator IDM. That is, a set frequency band of the first band pass filter BPF1 is lower than that of the band pass filter BPF, and a central frequency of the first band pass filter BPF1 may be greater than 0 Hz.

Similarly, the second band pass filter BPF21 may be connected to an output terminal of the second demodulator QDM. A central frequency of a passband of the second band pass filter BPF2 may be set equal to that of the low frequency band in the output signal of the second demodulator QDM. That is, a set frequency band of the second band pass filter BPF2 is lower than that of the band pass filter BPF, and a central frequency of the second band pass filter BPF2 may be greater than 0 Hz.

The first band pass filter BPF1 and the second band pass filter BPF2 may employ the above-described configuration shown in FIG. 6. That is, the first band pass filter BPF1 and the second band pass filter BPF2 may be configured identically to the band pass filter BPF, except their central frequencies.

The first analog-to-digital converter ADC1 may convert an output signal of the first band pass filter BPF1 into a first digital signal OUT1'. The second analog-to-digital converter ADC2 may convert an output signal of the second band pass filter BPF2 into a second digital signal OUT2'.

In the first analog front end AFE1$b$ shown in FIG. 12, when any input signal is not supplied to the charge amplifier CAMP, direct current DC (i.e., 0 Hz) noise may occur. The DC noise may pass through the first and second low pass filters LPF1 and LPF2. However, in the first analog front end AFE1$c$ shown in FIG. 13, the DC noise does not pass through the first and second band pass filters BPF1 and BPF2.

The signal processor DSP may determine a final sensing value, based on the first digital signal OUT1' and the second digital signal OUT2'. For example, the signal processor DSP may determine a final sensing value by adding a square value of the first digital signal OUT1' and a square value of the second digital signal OUT2'.

In a sensor device and a driving method thereof in accordance with the present disclosure, the size and power consumption of a filter can be decreased, and the center frequency and Q factor of the filter can be stably maintained.

Example embodiments have been disclosed herein, and although specific terms are employed, they are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A sensor device comprising:
a plurality of first sensors;
a plurality of second sensors generating a mutual capacitance with the plurality of first sensors;
a sensor transmitter connected to the plurality of first sensors, the sensor transmitter supplying driving signals to the plurality of first sensors; and
a sensor receiver connected to the plurality of second sensors, the sensor receiver receiving sensing signals from the second sensors,
wherein the sensor receiver includes a band pass filter including a plurality of paths connected in parallel, and wherein a first path among the plurality of paths sequentially includes a first input mixer, a first filter, and a first output mixer,
wherein a frequency and a phase of a first input clock signal received by the first input mixer are equal to a frequency and a phase of a first output clock signal received by the first output mixer.

2. The sensor device of claim 1, wherein a central frequency of a passband of the first filter is set as a difference or a sum of the frequency of the input clock signal and a frequency of the driving signals.

3. The sensor device of claim 2, wherein the frequency of the first input clock signal is equal to the frequency of the driving signals.

4. The sensor device of claim 2, wherein the frequency of the first input clock signal is different from the frequency of the driving signals.

5. A sensor device comprising:
a plurality of first sensors;
a plurality of second sensors generating a mutual capacitance with the plurality of first sensors;
a sensor transmitter connected to the plurality of first sensors, the sensor transmitter supplying driving signals to the plurality of first sensors; and
a sensor receiver connected to the plurality of second sensors, the sensor receiver receiving sensing signals from the second sensors, wherein the sensor receiver includes a band pass filter including a plurality of paths connected in parallel, and wherein a first path among the plurality of paths sequentially includes a first input mixer, a first filter, and a first output mixer, wherein a second path among the plurality of paths sequentially includes a second input mixer, a second filter, and a second output mixer, and wherein a phase of a first input clock signal received by the first input mixer is different from a phase of a second input clock signal received by the second input mixer.

6. The sensor device of claim 5, wherein a frequency of the first input clock signal is equal to a frequency of the second input clock signal.

7. A sensor device comprising:
a plurality of first sensors;
a plurality of second sensors generating a mutual capacitance with the plurality of first sensors;
a sensor transmitter connected to the plurality of first sensors, the sensor transmitter supplying driving signals to the plurality of first sensors; and
a sensor receiver connected to the plurality of second sensors, the sensor receiver receiving sensing signals from the second sensors,
wherein the sensor receiver includes a band pass filter including a plurality of paths connected in parallel, and wherein a first path among the plurality of paths sequentially includes a first input mixer, a first filter, and a first output mixer,
wherein the sensor receiver further includes a charge amplifier configured to receive the sensing signals from two sensors among the second sensors, and wherein the band pass filter is connected to an output terminal of the charge amplifier.

8. The sensor device of claim 7, wherein the sensor receiver further includes:
a mixer configured to mix an output signal of the band pass filter and a local clock signal;
a low pass filter configured to filter an output signal of the mixer to have a set frequency band; and
an analog-to-digital converter configured to convert an output signal of the low pass filter into a digital signal.

9. The sensor device of claim 7, wherein the sensor receiver further comprises:
a first demodulator configured to demodulate an output signal of the band pass filter, based on a first demodulation clock signal; and
a second demodulator configured to demodulate the output signal of the band pass filter, based on a second demodulation clock signal having a phase different by 90 degrees from a phase of the first demodulation clock signal.

10. The sensor device of claim 9, wherein the sensor receiver further comprises:
a first low pass filter configured to filter an output signal of the first demodulator to have a set frequency band; and
a second low pass filter configured to filter an output signal of the second demodulator to have a set frequency band.

11. The sensor device of claim 10, wherein the set frequency bands of the first low pass filter and the second low pass filter is lower than a set frequency band of the band pass filter.

12. The sensor device of claim 11, wherein the sensor receiver further comprises a first analog-to-digital converter configured to convert an output signal of the first low pass filter into a first digital signal; and a second analog-to-digital converter configured to convert an output signal of the second low pass filter into a second digital signal.

13. The sensor device of claim 12, wherein the sensor receiver further comprises a signal processor configured to determine a final sensing value by adding a square value of the first digital signal and a square value of the second digital signal.

14. The sensor device of claim 9, wherein the sensor receiver further comprises:
a first band pass filter configured to filter an output signal of the first demodulator to have a set frequency band; and
a second band pass filter configured to filter an output signal of the second modulator to have a set frequency band.

15. The sensor device of claim 14, wherein the set frequency bands of the first band pass filter and the second band pass filter are lower than a set frequency band of the band pass filter, and have central frequencies greater than 0 Hz.

16. The sensor device of claim 15, wherein the sensor receiver further comprises:
a first analog-to-digital converter configured to convert an output signal of the first band pass filter into a first digital signal; and
a second analog-to-digital converter configured to convert an output signal of the second band pass filter into a second digital signal.

17. The sensor device of claim 16, wherein the sensor receiver further includes a signal processor configured to determine a final sensing value by adding a square value of the first digital signal and a square value of the second digital signal.

18. A method of driving a sensor device, the method comprising:
supplying driving signals to a plurality of first sensors;
receiving sensing signals from two adjacent second sensors generating a mutual capacitance with the first sensors;
amplifying a difference of the sensing signals to generate an amplified signal; and
filtering the amplified signal by passing the amplified signal through a plurality of paths connected in parallel, wherein a path among the plurality of paths sequentially includes an input mixer, a filter, and an output mixer,
wherein a frequency and a phase of a first input clock signal received by the first input mixer are equal to a frequency and a phase of a first output clock signal received by the first output mixer.

* * * * *